(12) United States Patent
Jo

(10) Patent No.: US 8,148,050 B2
(45) Date of Patent: Apr. 3, 2012

(54) METHOD FOR FABRICATING PROBE NEEDLE TIP OF PROBE CARD

(75) Inventor: Byung Ho Jo, Gyeonggi-do (KR)

(73) Assignees: Byung Ho Jo, Yongin-si, Gyeonggi-do (KR); Microfriend Inc., Gunpo-si, Gyeonggi-do (KR)

( * ) Notice: Subject to any disclaimer, the term of this patent is extended or adjusted under 35 U.S.C. 154(b) by 621 days.

(21) Appl. No.: 11/989,955

(22) PCT Filed: May 8, 2006

(86) PCT No.: PCT/KR2006/001715
§ 371 (c)(1),
(2), (4) Date: Feb. 4, 2008

(87) PCT Pub. No.: WO2007/026985
PCT Pub. Date: Mar. 8, 2007

(65) Prior Publication Data
US 2009/0155724 A1    Jun. 18, 2009

(30) Foreign Application Priority Data
Aug. 31, 2005  (KR) .................. 10-2005-0080868

(51) Int. Cl.
G03F 7/00 (2006.01)
G03F 7/26 (2006.01)
G03F 7/36 (2006.01)
G03F 7/40 (2006.01)

(52) U.S. Cl. ........ 430/311; 430/312; 430/318; 430/330; 430/331

(58) Field of Classification Search .................. 430/311, 430/312, 318, 330, 331
See application file for complete search history.

(56) References Cited

U.S. PATENT DOCUMENTS

| | | | |
|---|---|---|---|
| 5,513,430 A | 5/1996 | Yanof et al. | |
| 6,713,374 B2* | 3/2004 | Eldridge et al. | 438/611 |
| 6,937,037 B2* | 8/2005 | Eldridge et al. | 324/754 |
| 7,555,836 B2* | 7/2009 | Mathieu et al. | 29/876 |
| 7,692,434 B2* | 4/2010 | Hoshino et al. | 324/754 |
| 7,714,235 B1* | 5/2010 | Pedersen et al. | 174/267 |
| 7,731,546 B2* | 6/2010 | Grube et al. | 439/700 |

FOREIGN PATENT DOCUMENTS
KR   10-0441809   7/2004

OTHER PUBLICATIONS
PCT International Search Report for PCT Counterpart Application No. PCT/KR2006/001715, 2 pgs (Aug. 16, 2006).
Written Opinion of the International Search Authority for PCT Counterpart Application No. PCT/KR2006/001715, 4 pgs (Aug. 16, 2006).

* cited by examiner

*Primary Examiner* — Amanda C. Walke
(74) *Attorney, Agent, or Firm* — Blakely, Sokoloff, Taylor & Zafman LLP.

(57) ABSTRACT

Disclosed herein is a method for fabricating a probe needle tip of a probe card, in which, in order to prevent a poor grinding effect caused by irregular removal or flexibility of the photoresists laminated to be high in the course of polishing a first metal loaded into the opening of the photoresists laminated into a multilayer configuration upon formation of the probe needle tip of the probe card, a second metal is laminated on any one of one or more stacked photoresist layers, thus firmly holding the photoresist layers on/beneath the metal.

6 Claims, 6 Drawing Sheets

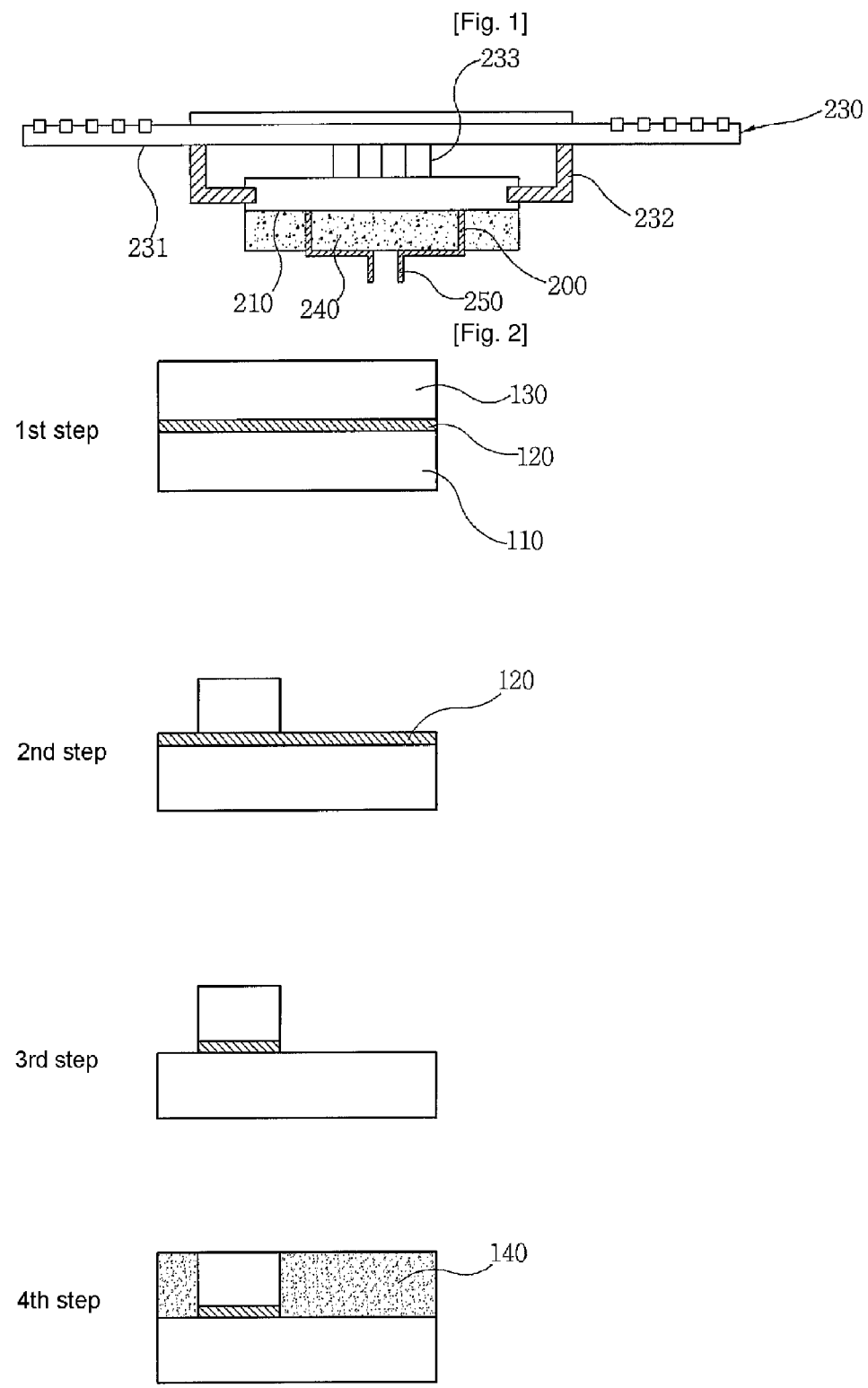

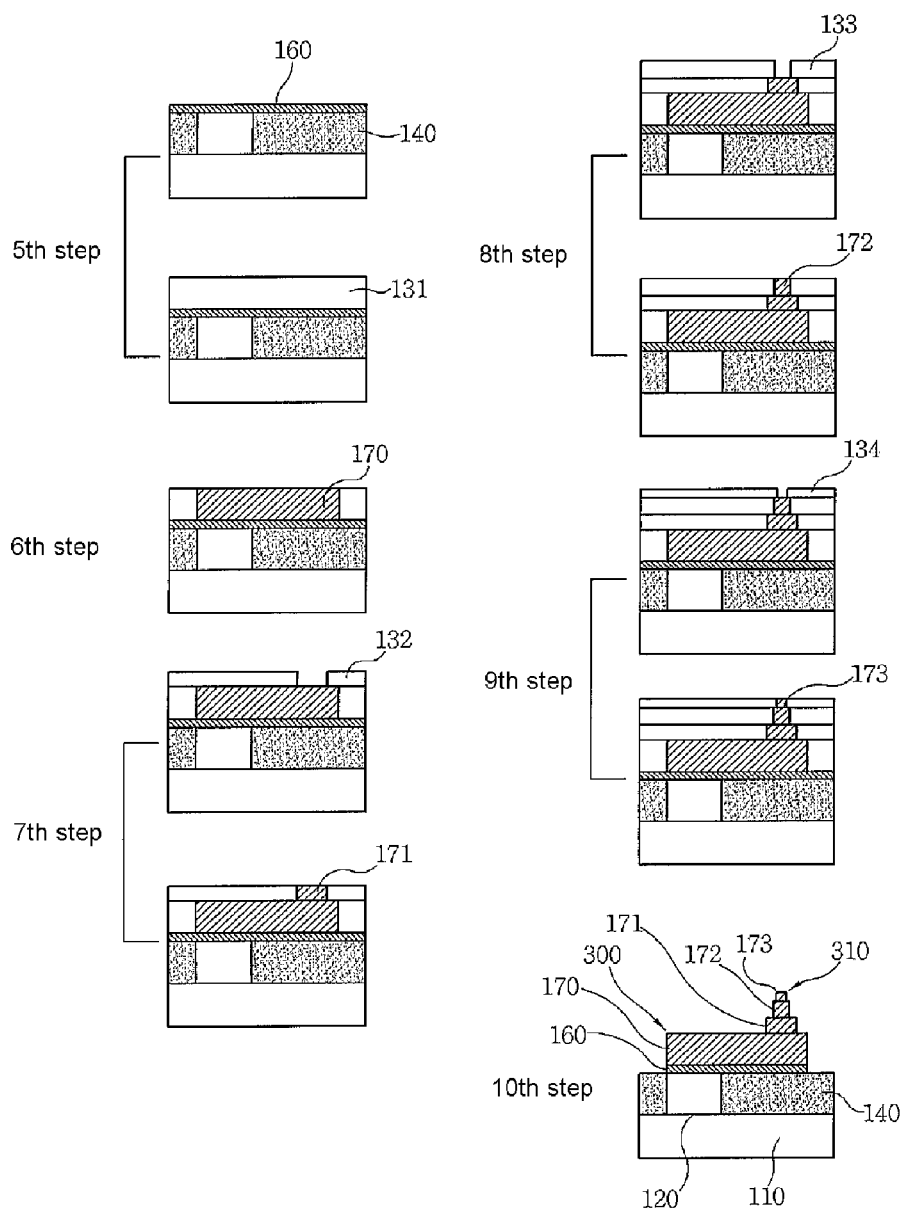

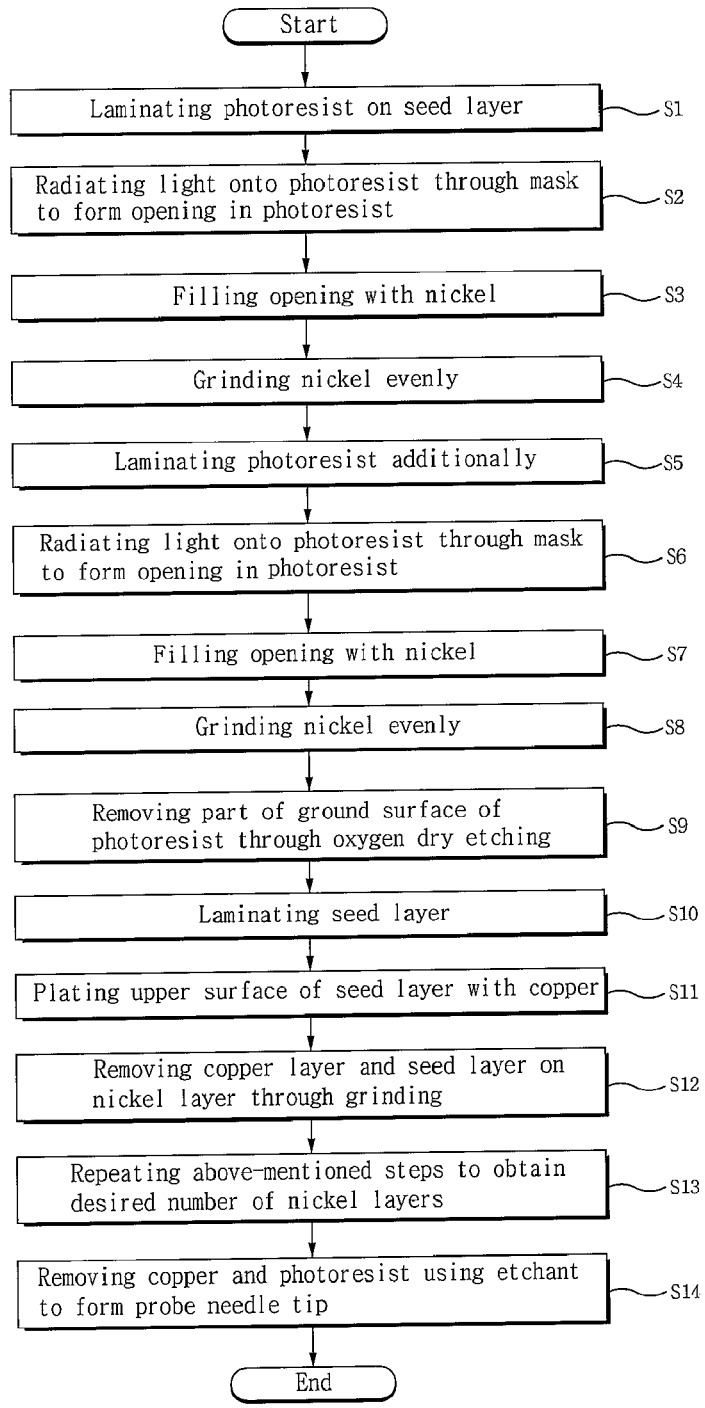
[Fig. 4]

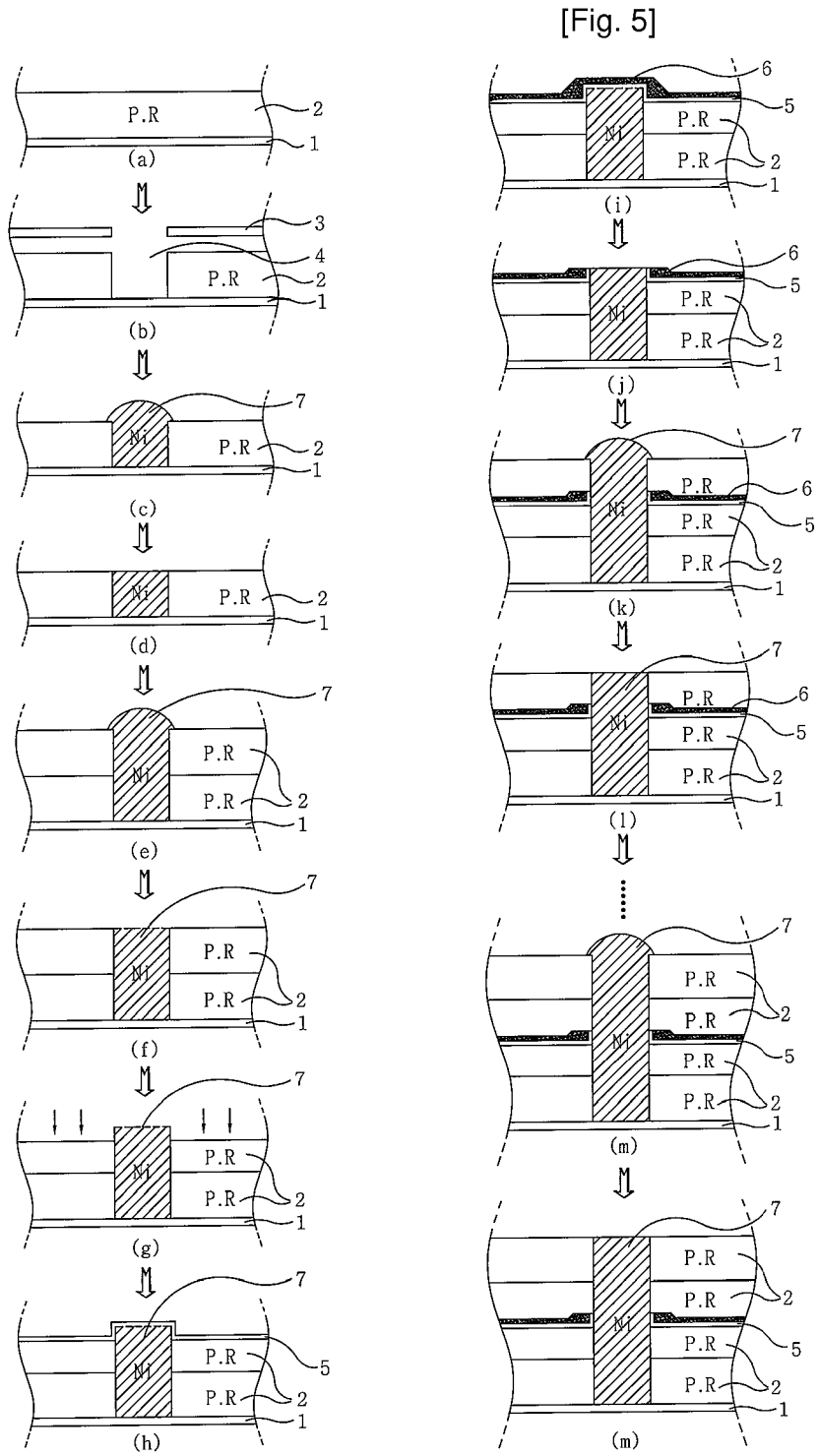

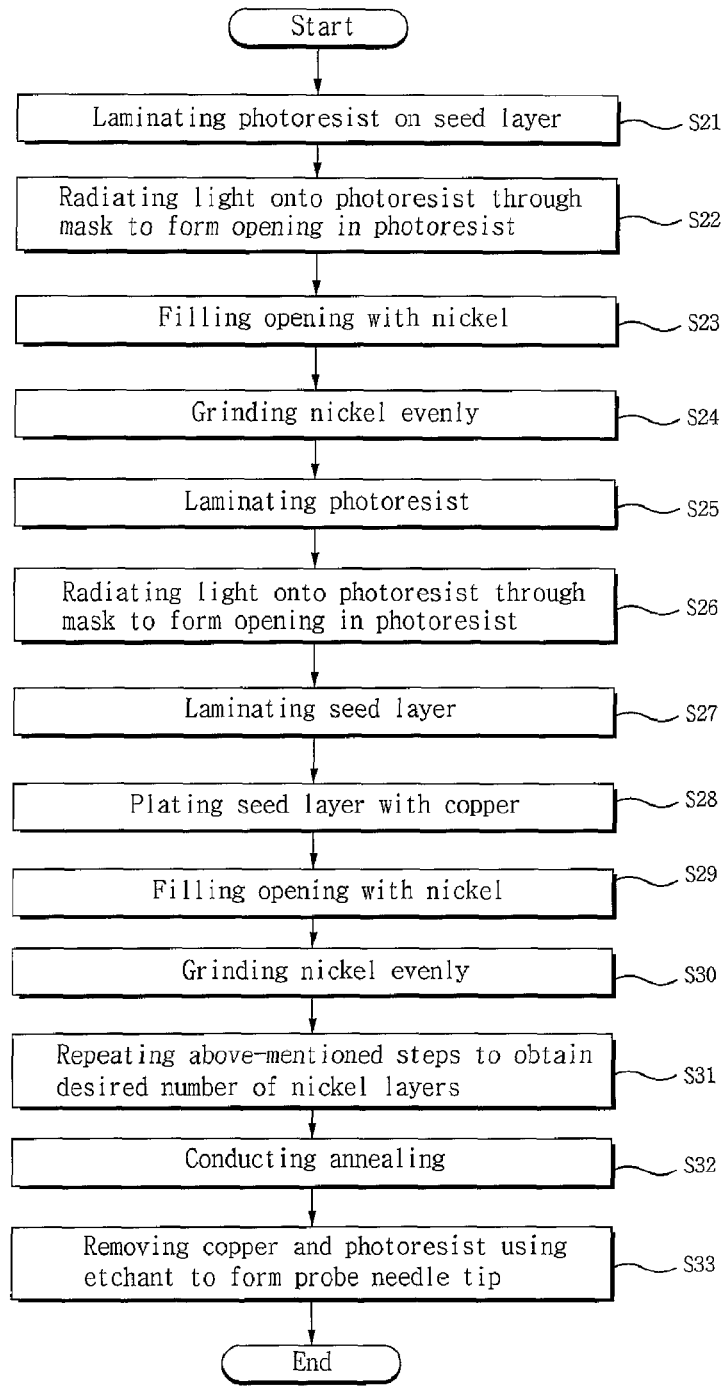
[Fig. 6]

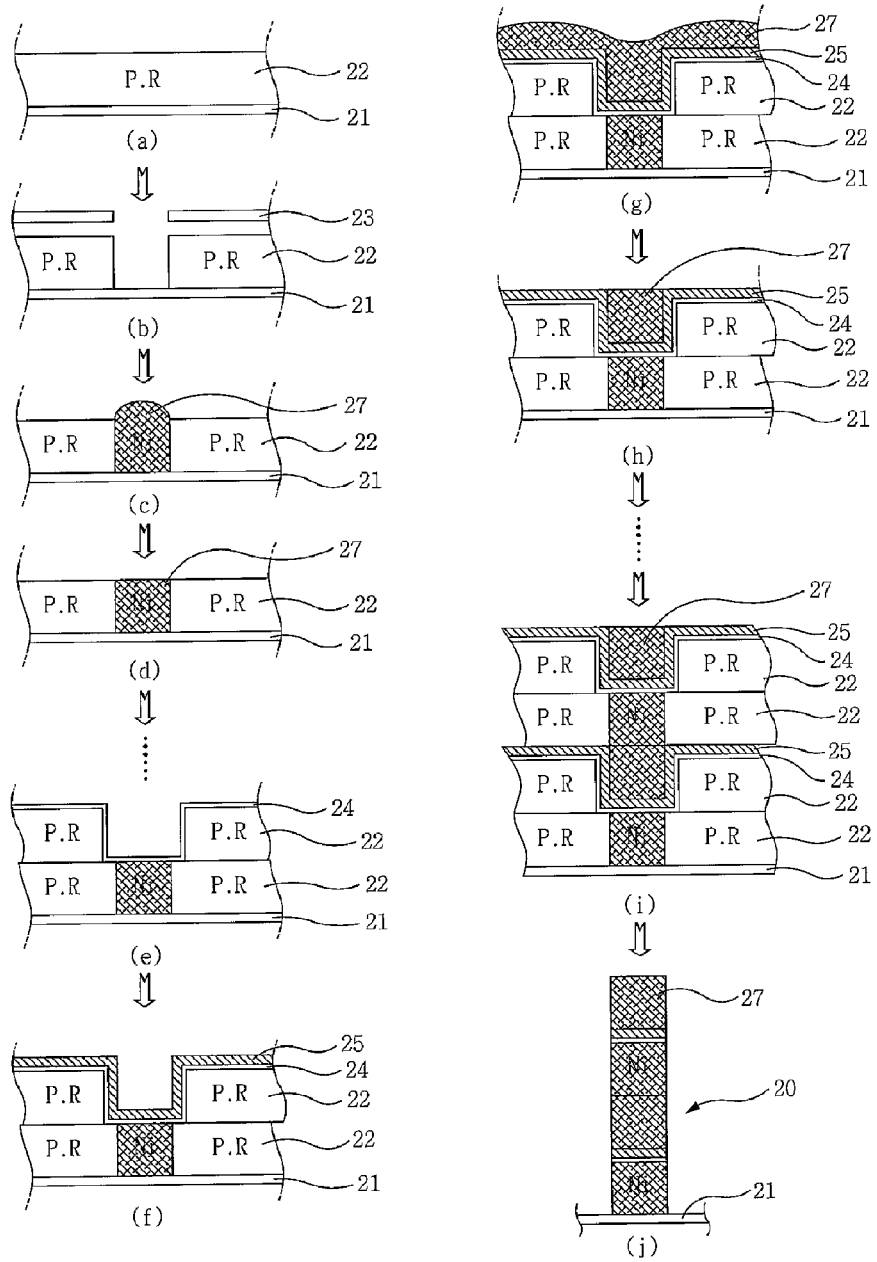

METHOD FOR FABRICATING PROBE NEEDLE TIP OF PROBE CARD

TECHNICAL FIELD

The present invention relates to a probe card, and particularly, to a method for fabricating a probe needle tip of a probe card.

BACKGROUND ART

As shown in FIG. 1, a conventional probe card is composed of a PCB (Printed Circuit Board) 230 connected to a test head that functions to transfer an electrical signal from a tester, a multilayered ceramic substrate 210 positioned under the PCB 230 and electrically connected thereto by a plurality of fine interface pins 233, jigs 232 for mechanically holding the PCB 230, the plurality of interface pins 233, and the multilayered ceramic substrate 210, and a plurality of probe needles 200 attached to the lower surface of the multilayered ceramic substrate 210 to be in contact with an electronic and electric device.

The probe needle 200 is formed in a manner such that a probe needle base formed of conductive metal and a polymer elastomer 240 are formed on the ceramic substrate 210 through photolithography using a photoresist, after which the conductive metal is continuously laminated on the probe needle base to be supported by the polymer elastomer 240, thus forming a probe needle tip 250.

As shown in FIGS. 2 and 3, the method for forming the probe needle includes, a first step of depositing a seed layer 120 on a multilayered ceramic substrate 110, applying a photoresist 130 on the seed layer, and then baking it; a second step of exposing and developing the photoresist according to the pattern of a mask, thus forming an island type probe needle base; a third step of etching the seed layer 120 corresponding to an exposed region after removal of the photoresist in the second step; a fourth step of embedding the exposed portion with a polymer elastomer 140; a fifth step of depositing a seed layer 160 on the polymer elastomer, applying a photoresist 131 on the seed layer, and then baking it; a sixth step of patterning the photoresist in a desired shape according to the pattern of a mask through exposure and development, and then plating the exposed portion with a conductive metal 170 composed of a nickel alloy; a seventh step of applying a photoresist 132 on the layer formed in the sixth step, baking it, radiating light onto the photoresist to develop the photoresist into a desired shape, and then plating the exposed portion with a conductive metal 171 composed of a nickel alloy; an eighth step of applying a photoresist 133 on the layer formed in the seventh step, baking it, radiating light onto the photoresist to develop the photoresist into a desired shape, and then filling the exposed portion with a conductive metal 172 composed of a nickel alloy; a ninth step of applying a photoresist 134 on the layer formed in the eighth step, baking it, radiating light onto the photoresist to develop the photoresist into a desired shape, and then filling the exposed portion with a conductive metal 173 composed of a nickel alloy, thus forming a probe needle tip of a probe needle; and a tenth step of removing the seed layers and the photoresists from the polymer elastomer so that only the conductive metals constituting the probe needle remain.

As such, a plating process is conducted using the conductive metal, after which a surface flattening process is conducted using a grinder and a polisher, and then subsequent procedures are performed.

In addition, in the case where the probe needle tip of the conventional probe needle is formed into a multilayer configuration, procedures of plating the portion exposed through exposure and development with the nickel alloy as the conductive metal and then evenly polishing the nickel alloy are carried out.

However, as described above, upon continuous lamination of the photoresist layers, it is impossible to polish the third and subsequent photoresist layers because of irregular removal or flexibility of the photoresist layer.

DISCLOSURE OF INVENTION

Technical Problem

Accordingly, the present invention has been made keeping in mind the above problems occurring in the related art, and an object of the present invention is to provide a method for fabricating a probe needle tip of a probe card, in which, in order to prevent a poor grinding effect caused by irregular removal or flexibility of the photoresists laminated to be high in the course of polishing a first metal (e.g., nickel or a nickel alloy) loaded into the opening of the photoresists laminated into a multilayer configuration upon formation of the probe needle tip of the probe card, a second metal (e.g., copper) is laminated on any one of one or more stacked photoresist layers, thus firmly holding the photoresist layers on/beneath the metal.

Technical Solution

According to a first embodiment for achieving the above object, the present invention provides a method for fabricating a probe needle tip of a probe card, the method comprising, a first step of applying a photoresist on a seed layer; a second step of radiating light onto the photoresist through a mask having a predetermined pattern, thus forming an opening in the photoresist according to the pattern of the mask; a third step of filling the opening with a first metal; a fourth step of evenly grinding the first metal to be flush with the photoresist; a fifth step of laminating a seed layer and a second metal on the surface of the first metal which is ground; a sixth step of repeating the above-mentioned steps until the desired number of layers is obtained; and a seventh step of removing the metal and photoresist using an etchant, thus forming the probe needle tip.

Preferably, The method of the present invention further comprises, laminating the photoresist, radiating light onto the photoresist through the mask having a predetermined pattern, thus forming the opening in the photoresist according to the pattern of the mask; filling the opening with the first metal; and then evenly grinding the first metal to be flush with the photoresist, so as to laminate the second metal on one or more first metal layers, between the fourth step and the fifth step.

In addition, the method of the present invention preferably further comprises, etching the surface of the photoresist to be lower than the surface of the first metal through oxygen dry etching, depositing the seed layer, laminating the second metal layer on the seed layer, and then conducting a grinding process to expose the first metal layer, before laminating the second metal on one or more first metal layers, between the fourth step and the fifth step.

As such, the first metal may be preferably nickel and a nickel alloy, and the second metal may be preferably copper. As the second metal, the other metals such as gold (Au) may be used. That is, respective etchants of the first metal and the second metal should not dissolve the oppositely situated metal.

According to a second embodiment, the present invention provides a method for fabricating a probe needle tip of a probe card, the method comprising, a first step of applying a photoresist on a seed layer; a second step of radiating light onto the photoresist through a mask having a predetermined pattern, thus forming an opening in the photoresist according to the pattern of the mask; a third step of laminating the seed layer on the photoresist and then plating it with a second metal; a fourth step of filling the opening with a first metal; a fifth step of evenly grinding the first metal to expose the second metal; a sixth step of repeating the above-mentioned steps until the desired number of first metal layers is obtained; a seventh step of conducting an annealing process to alloy the second metal with the first metal at the interface with the first metal so as not to remove an alloyed portion from the second metal upon removal of the second metal; and an eighth step of removing the second metal and the photoresist using an etchant, thus forming the probe needle tip.

As such, the method preferably further comprises, filling the opening with the first metal, evenly grinding the first metal laminating a second photoresist on the first metal, and radiating light onto the photoresist through the mask having a predetermined mask, thus forming the opening in the photoresist according to the pattern of the mask, so as to plate the second metal on one or more photoresists, between the second step and the third step.

Advantageous Effects

According to the present invention, there is provided a method for fabricating a probe needle tip of a probe card, in which, in order to prevent a poor grinding effect caused by the irregular removal or flexibility of the photoresists laminated to be high in the course of polishing a first metal loaded into the opening of the photoresists laminated into a multilayer configuration upon formation of the probe needle tip of the probe card, a second metal is laminated on any one of one or more stacked photoresist layers, thus firmly holding the photoresist layers on/beneath the metal.

BRIEF DESCRIPTION OF THE DRAWINGS

FIG. 1 is a view showing the structure of a conventional probe card;

FIGS. 2 and 3 are cross-sectional views showing a conventional process for forming the probe needle tip of a probe card on the polymer elastomer layer of the probe card;

FIG. 4 is a flowchart showing a process for forming a probe needle tip of a probe card, according to a first embodiment of the present invention;

FIG. 5 is cross-sectional views of the probe needle tip of the probe card, according to the process of FIG. 4;

FIG. 6 is a flowchart showing a process for forming a probe needle tip of a probe card, according to a second embodiment of the present invention;

FIG. 7 is cross-sectional views of the probe needle tip of the probe card, according to the process of FIG. 6.

MODE FOR THE INVENTION

Hereinafter, a detailed description of the present invention will be given with reference to the appended drawings.

FIG. 4 is a flowchart showing the process for fabricating a probe needle tip of a probe card according to a first embodiment of the present invention, and FIG. 5 is cross-sectional views according to the process of fabricating the probe needle tip of FIG. 4. In the present embodiment, it is assumed that a first metal is nickel, and a second metal is copper. Referring to FIGS. 4 and 5, a photoresist is laminated on a seed layer to a predetermined thickness, in the step (a), corresponding to S1. Subsequently, light is radiated onto the photoresist 2 through a mask 3 having a predetermined pattern, thus forming an opening 4 according to the pattern of the mask 3, in the step (b), corresponding to S2. Then, the opening is filled with nickel (or a nickel alloy) 7 as the first metal in the step (c), corresponding to S3. Thereafter, the nickel (or nickel alloy) is evenly ground and polished in the step (d), corresponding to S4. The above procedures are repeated according to S5 to S8, thus double nickel (or nickel alloy) layers and photoresist layers are formed as in the step (f). The part of the surface of the photoresist is removed through oxygen dry etching in the step (g), corresponding to S9. Then, a seed layer 5 of titanium (Ti) is laminated on the photoresist in the step (h), corresponding to S10. Subsequently, a copper layer 6 as a second metal is laminated thinly on the seed layer 5 in the step (i), corresponding to S11, after which the seed layer 5 and the copper layer 6 on the nickel layer are polished to the height of the nickel (or nickel alloy) in the step (j), corresponding to S12. The above procedures are repeated to obtain the desired number of nickel (or nickel alloy) layers in S13. The copper layer and the photoresist are removed using an etchant in S14, thus forming a probe needle tip. As such, as the first metal, useful is palladium (Pd), rhodium (Rd), or tungsten (W).

Turning now to FIG. 6, a flowchart showing the process for fabricating a probe needle tip of a probe card, according to a second embodiment of the present invention, is shown. FIG. 7 is cross-sectional views of the probe needle tip of the probe card according to the process of FIG. 6. Referring to FIG. 7, the method for fabricating the probe needle tip of the probe card is described. That is, a photoresist 22 is laminated on a seed layer 21 to a predetermined thickness, in the step (a), corresponding to S21. Then, light is radiated onto the photoresist 22 through a mask 23 having a predetermined pattern, thus forming an opening according to the pattern of the mask 23, in the step (b), corresponding to S22. The opening is filled with nickel (or a nickel alloy) 27 in the step (c), corresponding to S23. Thereafter, the nickel (or nickel alloy) 27 is evenly ground and polished to be flush with the photoresist in the step (d), corresponding to S24. The photoresist 22 is additionally laminated to a predetermined thickness in S25. The light is radiated onto the photoresist 22 through the mask 23, thus forming the opening according to the pattern of the mask 23, in the step (e), corresponding to S26. Further, a seed layer 24 is laminated on the photoresist in the step (e), corresponding to S27. Subsequently, a copper layer 25 is laminated thinly on the seed layer 24 in the step (f), corresponding to S28. The opening plated with copper is filled with nickel (or nickel alloy) 27 in the step (g), corresponding to S29. The nickel (or nickel alloy) is evenly ground and polished in the step (h), corresponding to S30. The above procedures are repeated to obtain the desired number of nickel (or nickel alloy) layers in S31, and thus the upper surface of the photoresist is plated with copper 25 as in the step (i). The annealing process is conducted in S32, after which the copper layer 25 and the photoresist 22 are removed using an etchant, thus forming a probe needle tip 20, in the step (j), corresponding to S33.

As such, as the cooper etchant, $FeCl_3$+HCl or an ammonia hypochlorite solution may be used so as not to affect the nickel (or nickel alloy).

In addition, as an agent for use in removal of the photoresist, various materials are known, and thus the description thereof is omitted.

According to the above embodiment, a copper plating process is conducted between the second and third photoresist layers and between the fourth and fifth photoresist layers. Also, the metal layer may be formed on a desired photoresist layer (preferably, an even-numbered photoresist layer) to firmly hold the photoresist layers on/beneath the metal, so that a metal polishing process may be easily conducted.

Thereby, the flexibility of the photoresists formed into a multilayer configuration can be prevented when evenly polishing the nickel (or nickel alloy), by a series of procedures of radiating light onto the photoresist through the mask to form the opening according to the pattern of the mask, filling the opening with the nickel (or nickel alloy), and then plating the surfaces of the nickel (or nickel alloy) and photoresist with copper before additionally laminating the photoresist, in order to form plurality of nickel (or nickel alloy) layers upon the formation of the probe needle tip of the probe card.

In addition, the metal plated between the photoresist layers can function as a support to firmly hold the photoresist layers on/beneath the metal, by a series of procedures of radiating light onto the photoresist through the mask to form the opening according to the pattern of the mask, plating the upper surfaces of the opening and photoresist with copper, and then filling the opening with nickel (or nickel alloy), upon the formation of the probe needle tip of the probe card. Therefore, the flexibility of the photoresist can be overcome when evenly polishing the nickel (or nickel alloy).

The invention claimed is:

1. A method for fabricating a probe needle tip of a probe card, comprising:
   a first operation of applying a photoresist on a seed layer;
   a second operation of exposing and developing the photoresist according to a mask having a predetermined pattern, thus forming an opening in the photoresist according to the pattern of the mask;
   a third operation of filling the opening with a first metal;
   a fourth operation of evenly grinding the first metal to be flush with the photoresist and etching a surface of the photoresist to be lower than a surface of the first metal;
   a fifth operation of depositing an additional seed layer on the photoresist, laminating a second metal layer on the additional seed layer, and then conducting a grinding process to expose the first metal layer through the second metal layer; and
   a sixth operation of repeating the above-mentioned steps to obtain a desired number of layers; and
   a seventh operation of removing the second metal and photoresist using an etchant, thus forming the probe needle tip.

2. The method according to claim 1, further comprising additionally laminating the photoresist; exposing and developing the photoresist according to the mask having a predetermined pattern, thus forming the opening in the photoresist according to the pattern of the mask; filling the opening with the first metal; and then evenly grinding the first metal to be flush with the photoresist, in order to laminate the second metal on one or more first metal layers, between the fourth operation and the fifth operation.

3. The method according to claim 1 or 2, wherein etching the surface of the photoresist to be lower than a surface of the first metal is through oxygen dry etching.

4. The method according to claim 3, wherein the first metal comprises nickel or a nickel alloy, and the second metal comprises copper.

5. A method for fabricating a probe needle tip of a probe card, comprising:
   a first operation of applying a photoresist on a seed layer;
   a second operation of exposing an developing the photoresist according to a mask having a predetermined pattern, thus forming an opening in the photoresist according to the pattern of the mask;
   a third operation of laminating an additional seed layer on the photoresist and then plating it with a first metal;
   a fourth operation of filling the opening with a second metal;
   a fifth operation of evenly grinding the second metal to expose the first metal;
   a sixth operation of repeating the above-mentioned steps to obtain a desired number of second metal layers;
   a seventh operation of conducting an annealing process to alloy the first metal with the second metal at an interface with the second metal so as not to remove an alloyed portion from the first metal upon removal of the first metal; and
   an eighth operation of removing the first metal and photoresist using an etchant, thus forming the probe needle tip.

6. The method according to claim 5, further comprising filling the opening with the first metal, evenly grinding the first metal, laminating a second photoresist on the first metal, and exposing and developing the photoresist according to the mask having a predetermined mask, thus forming the opening in the photoresist according to the pattern of the mask, between the second operation and the third operation.

* * * * *